(12) United States Patent
Tran et al.

(10) Patent No.: US 7,079,224 B2
(45) Date of Patent: Jul. 18, 2006

(54) ARRANGEMENT FOR DEBRIS REDUCTION IN A RADIATION SOURCE BASED ON A PLASMA

(75) Inventors: Duc Chinh Tran, Goettingen (DE); Juergen Kleinschmidt, Weissenfels (DE)

(73) Assignee: XTREME technologies GmbH, Jena (DE)

( * ) Notice: Subject to any disclaimer, the term of this patent is extended or adjusted under 35 U.S.C. 154(b) by 144 days.

(21) Appl. No.: 10/784,438

(22) Filed: Feb. 23, 2004

(65) Prior Publication Data

US 2004/0165171 A1    Aug. 26, 2004

(30) Foreign Application Priority Data

Feb. 24, 2003  (DE) ................. 103 08 174

(51) Int. Cl.
*G03B 27/42* (2006.01)
(52) U.S. Cl. .................. 355/67; 355/71; 378/34; 378/35
(58) Field of Classification Search ............ None
See application file for complete search history.

(56) References Cited

U.S. PATENT DOCUMENTS

| | | | | |
|---|---|---|---|---|
| 6,064,072 A * | 5/2000 | Partlo et al. | ................ | 378/119 |
| 6,278,764 B1 * | 8/2001 | Barbee et al. | ................ | 378/84 |
| 6,285,737 B1 | 9/2001 | Sweatt et al. | ................ | 378/85 |
| 6,359,969 B1 | 3/2002 | Shmaenok | ................ | 378/156 |
| 6,377,651 B1 | 4/2002 | Richardson et al. | ........... | 378/34 |
| 6,859,259 B1 * | 2/2005 | Bakker et al. | ................ | 355/53 |
| 6,927,403 B1 * | 8/2005 | Singer et al. | ............. | 250/492.2 |
| 2003/0020890 A1 | 1/2003 | Ogushi et al. | ................ | 355/53 |

FOREIGN PATENT DOCUMENTS

| | | |
|---|---|---|
| DE | 101 28 284 | 2/2003 |
| DE | 101 36 620 | 2/2003 |
| DE | 102 15 469 | 11/2003 |
| WO | WO 02/27406 | 4/2002 |

OTHER PUBLICATIONS

Proceedings of SPIE, vol. 4146 (2000) pp. 128-131, Yamamoto et al. "Compact Debris Shutter Design of a laser-Produced Plasma Source for High NA Application".

* cited by examiner

*Primary Examiner*—D. Rutledge
(74) *Attorney, Agent, or Firm*—Reed Smith LLP

(57) ABSTRACT

The invention is directed to an arrangement for debris reduction in a radiation source based on a plasma, particularly for generating bundled radiation in the extreme ultraviolet (EUV) spectral region. The object of the invention, to find a novel possibility for beam shaping and debris reduction in a radiation source based on a plasma which substantially increases the life of collector optics without having to tolerate a substantial reduction in transparency or a sudden destruction of the protective mechanism, is met according to the invention in that exchangeable additional optics are arranged in the radiation path between a conventional debris filter and the collector optics, wherein a distance-increasing intermediate imaging of the source location relative to the collector optics is provided by the additional optics for further debris reduction.

12 Claims, 3 Drawing Sheets

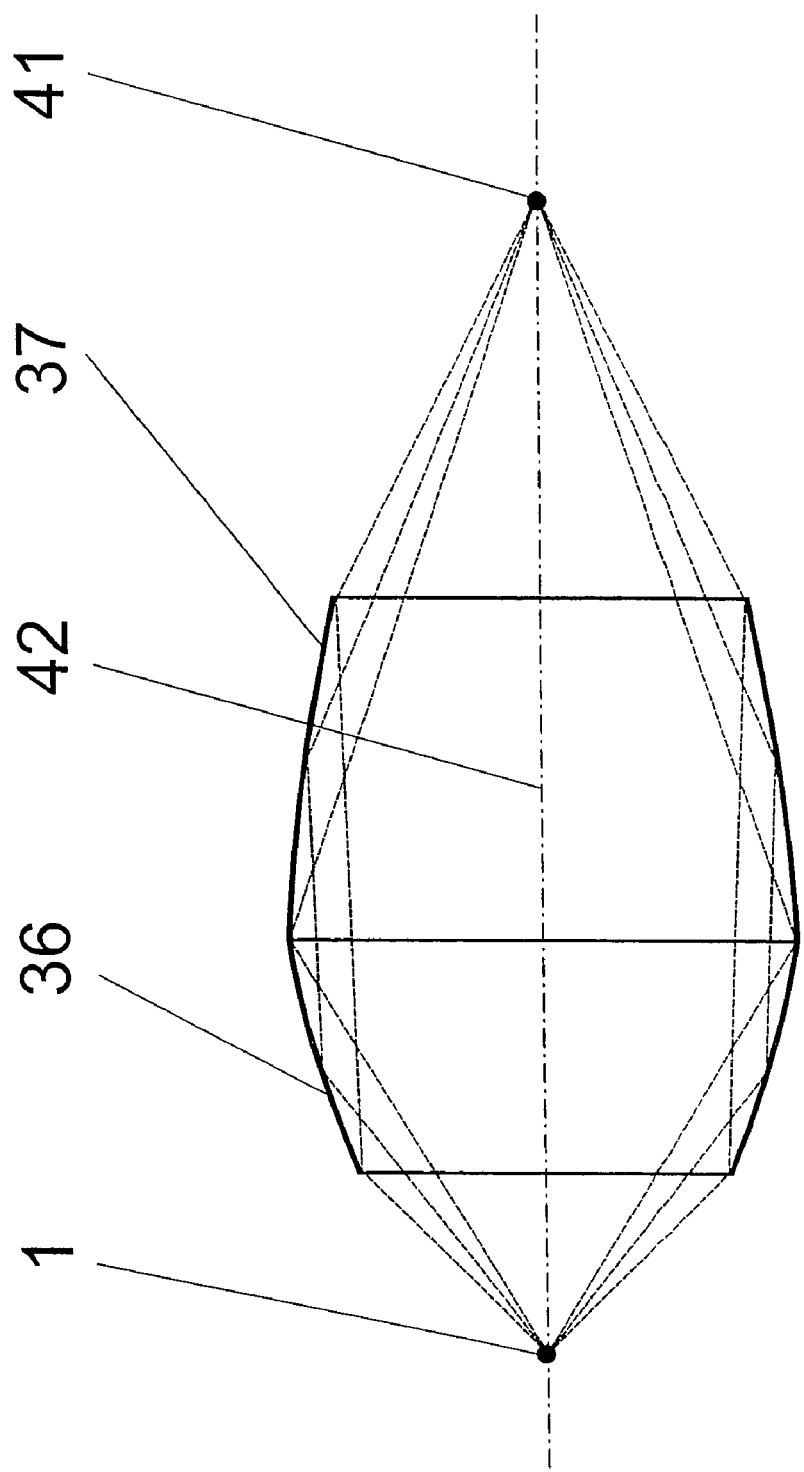

ARRANGEMENT FOR DEBRIS REDUCTION IN A RADIATION SOURCE BASED ON A PLASMA

CROSS-REFERENCE TO RELATED APPLICATION

This application claims priority of German Application No. 103 08 174.7, filed Feb. 24, 2003, the complete disclosure of which is hereby incorporated by reference.

BACKGROUND OF THE INVENTION a) Field of the Invention

The invention is directed to an arrangement for debris reduction in a radiation source based on a plasma, particularly for generating bundled radiation in the extreme ultraviolet (EUV) spectral region. The invention is preferably applied in semiconductor lithography for exposure of very small structures on semiconductor chips.

b) Description of the Related Art

Sources of extreme ultraviolet (EUV) radiation or soft x-ray radiation are urgently needed as radiation sources for the next generation of exposure machines in semiconductor lithography. The structure widths of integrated circuits should be reduced to a width between 25 nm and 50 nm with radiation at around 13.5 nm. Since the radiation for the desired wavelength range is generated from a hot plasma, an EUV radiation source also emits, in addition to the actual radiation, neutral particles and electrically charged particles with kinetic energies in the keV range. The totality of this particle emission is called debris. The debris causes reduced reflectivity of the collector optics arranged downstream of the source location (plasma) by wearing away the reflecting layer (substantial effect) or by coating this layer with particles which absorb the EUV radiation. The debris limits the life of the collector optics. The life of the collector optics is stated as a quantity of EUV radiation pulses after which the reflectivity of the collector optics drops by 10%. The producers of scanners for the semiconductor lithography process require an optics life of greater than $10^{11}$ shots (radiation pulses).

Various debris filters, known as debris mitigation tools (DMT), are known for reducing debris and thus protecting the collector optics from rapid aging through the processes mentioned above. For example, U.S. Pat. No. 6,359,969 describes various honeycombed arrangements of metal plates which can have various suitable shapes. Gases (e.g., argon) flow at sufficient pressure into the individual honeycombs. The gas causes a sharp deceleration of the debris particles until their kinetic energy is less than kT and the particles are subsequently easily adsorbed at the honeycomb structure.

In various other arrangements (e.g., DE 102 15 469.4 or U.S. Pat. No. 6,377,651), electric and/or magnetic fields are used to deflect charged particles.

Further, as is disclosed, e.g., in Yamamoto et al., Proc. of SPIE, Vol. 4146 (2000) 128, fast shutters are known which quickly close the radiation path after every radiation pulse and accordingly block slower particles. However, these shutters fail to function at the required pulse repetition frequencies of several kilohertz.

In other suggestions, a debris filter such as that also known from U.S. Pat. No. 6,359,969 is combined with EUV-transparent foils to achieve a complete filtering of debris. However, there is a considerable risk that these foils will be destroyed by especially high-energy particles. Particularly with EUV sources with high average outputs, there is a very high probability that the foil will be destroyed due to the inability to estimate for preventative purposes, which would mean a sudden and rapid deterioration of imaging conditions.

OBJECT AND SUMMARY OF THE INVENTION

It is the primary object of the invention to find a novel possibility for debris reduction in a radiation source based on a plasma, particularly for generating bundled radiation in the extreme ultraviolet (EUV) spectral region, which considerably prolongs the life of the collector optics without having to tolerate a substantial reduction in transparency or sudden destruction of the protective mechanism.

According to the invention, this object is met in an arrangement for debris reduction in a radiation source based on a plasma in which a debris filter is arranged between the radiation-generating plasma, as source location, and collector optics in that exchangeable additional optics are arranged in the radiation path between the debris filter and the collector optics, wherein a distance-increasing intermediate imaging of the source location (plasma) relative to the collector optics is provided by the additional optics for further debris reduction.

The substantial effect of the additional optics consists in that only the additional optics are damaged by residual debris following the debris filters and, with a generally beam-shaping function, adopt the role of an exchangeable additional filter which considerably prolongs the life of the substantially expensive collector optics.

The additional optics are advantageously reflection optics whose reflecting surfaces are preferably designed for reflection with grazing incidence of radiation. The reflecting surfaces of the additional optics are advisably shaped as curved surfaces of revolution. These surfaces of revolution can have the shape of ellipsoids of revolution, paraboloids of revolution or hyperboloids of revolution. The additional optics can also comprise a combination of differently curved surfaces of revolution.

In order to increase their stability relative to high-energy radiation from the plasma, the reflecting surfaces are advisably made of metal which is highly reflective in the EUV region.

The elements of the additional optics can advisably comprise highly reflective metallic base material into which the reflecting surfaces are incorporated or shaped. But the additional optics can also have reflecting surfaces which are coated only by a highly reflective metallic coat. At least the reflecting surfaces of the additional optics advantageously contain at least one of the metals, molybdenum, rhodium or palladium, to achieve sufficient stability relative to the high-energy radiation in addition to the high reflectivity.

The solution according to the invention makes it possible to realize an arrangement for debris reduction in a radiation source based on a plasma, particularly for generating bundled radiation in the extreme ultraviolet (EUV) spectral region which substantially increases the life of the collector optics in that additional optics are used as inexpensive intermediate-imaging auxiliary optics which capture residual particles of debris passed by the debris filter through an increase in distance and, in addition, adhesive surfaces in front of the collector optics.

The invention will be described more fully in the following with reference to embodiment examples.

BRIEF DESCRIPTION OF THE DRAWINGS

In the drawings:

FIG. 4 shows a preferred variant of the additional optics with a combination of differently curved surfaces of revolution (hyperboloid and ellipsoid).

DESCRIPTION OF THE PREFERRED EMBODIMENTS

Figure 1:
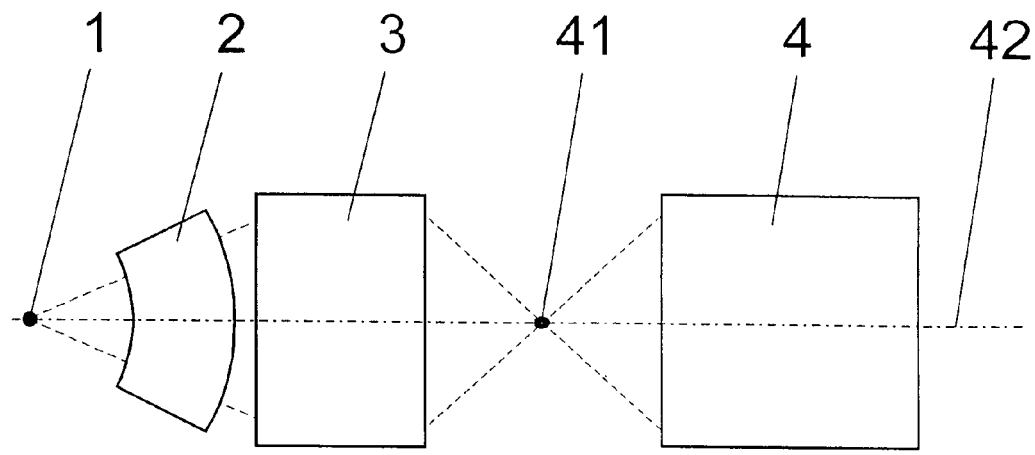
FIG. 1 is a schematic view of the arrangement according to the invention from the radiation-emitting plasma to the collector optics.

In its basic construction, as is shown schematically in FIG. 1, the arrangement according to the invention comprises a plasma 1 emitting the desired radiation, any selected debris filter 2, known per se, exchangeable additional optics 3, and collector optics 4.

The additional optics 3 are simple imaging optics which generate an intermediate image of the source, i.e., of the plasma 1. This imaging which results in an intermediate image 41 on the optical axis 42 of the collector optics 4 is used as a new source point for the complicated and comparatively expensive collector optics 4. The advantage consists in that only the additional optics 3 are damaged by residual debris which has not been intercepted by the conventional debris filter 2, while the actual collector optics 4 still only "see" the desired EUV radiation.

The additional optics 3 can be exchanged easily when reaching a defined degree of reduction of its reflectivity, so that the life of the collector optics 4 is no longer limited in practice by the reduction in reflectivity due to debris from the plasma 1.

The additional optics 3 are constructed in such a way that the reflection is carried out in grazing incidence and their reflecting surfaces 33 or 34, 35 or 36, 37 (shown only in FIGS. 2, 3 and 4) are made from a material with good reflectivity in the desired EUV spectral region (e.g., molybdenum, rhodium, palladium or the like).

In order to effectively realize the grazing incidence from the plasma 1, the additional optics 3 have reflecting surfaces in the form of surfaces of revolution around the optical axis 42. Various embodiment forms of the additional optics 3 which provide for different qualitative features of the intermediate imaging are suitable for this purpose. Ellipsoids of revolution 33 comprising one or more parts, multi-part paraboloids 34, 35 or hyperboloids 36 as well as combinations of these surfaces of revolution with different curvatures can reasonably be used.

Figure 2A:
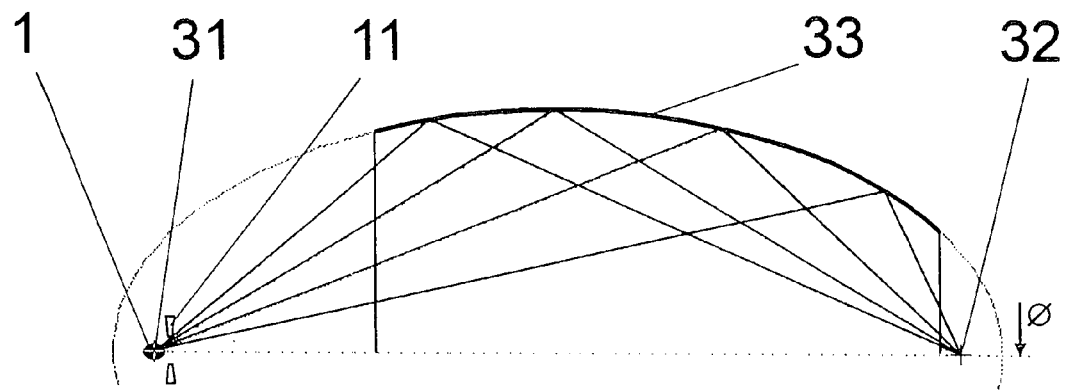
FIGS. 2a–c are three half-sectional drawings showing an arrangement of the additional optics with a reflecting surface in the form of an ellipsoid of revolution in which different intermediate images are generated depending upon the position and extension of the plasma and, therefore, upon the incident angle on the reflecting surface.
Figure 2B:
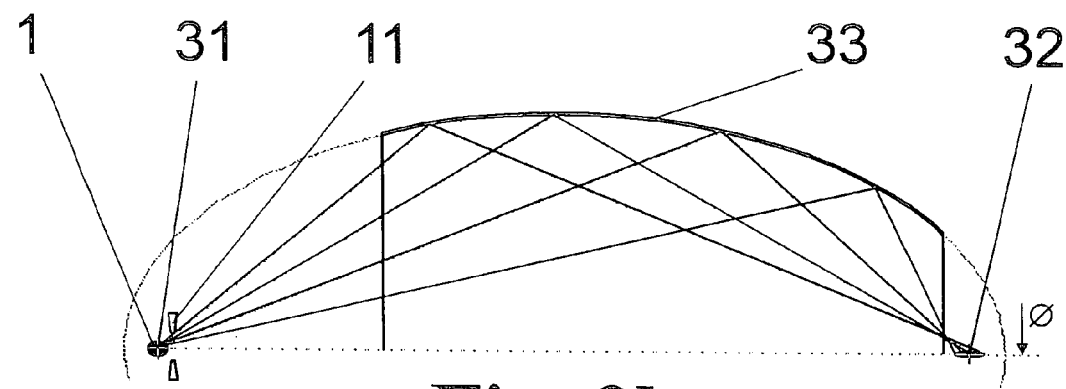
Figure 2C:
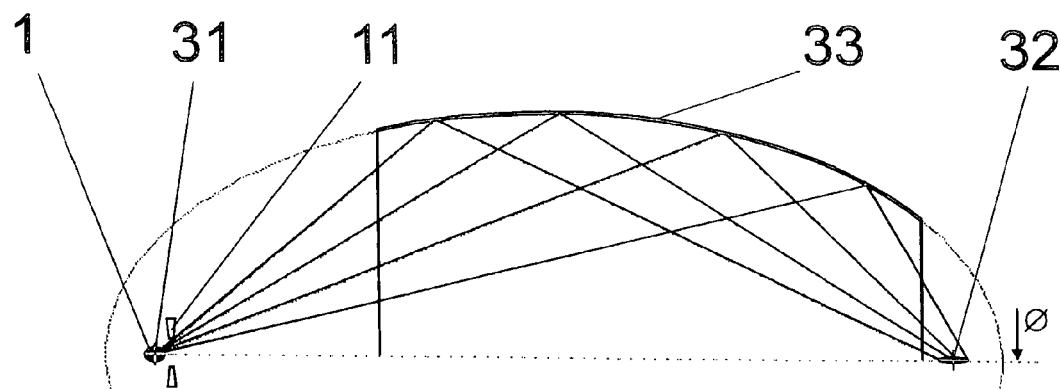

FIGS. 2a to 2c show a construction of the additional optics 3 in which the reflecting surface corresponds to the middle part of an ellipsoid of revolution 33.

FIG. 2a shows the plasma 1 in a first focal point 31 of the ellipsoid of revolution 33 and the imaging of the plasma 1 as intermediate image 41 in the second focal point 32. In this arrangement, in which the debris filter 2 has been omitted for purposes of a clearer illustration of the additional optics 3, an intermediate image 41 is generated as a source point of the EUV radiation for the collector optics 4; this intermediate image 41 is not an exact image of the plasma 1 or only fills the latter approximately for small aperture angles or for a small angular area. This is related to the fact that the position of the intermediate image 41 along the optical axis 42 varies during reflection at the inner surface of the ellipsoid of revolution 33, specifically depending upon the reflection angle at the reflecting surface 33, because the source location does not lie exactly in the focal point 31 of the ellipsoid 33 in punctiform manner.

This effect can be limited in that the emitted EUV radiation of the plasma 1 can exit uniformly only through a relatively small outlet opening 11 of a vacuum chamber (not shown) that is already provided for plasma generation.

However, an exact imaging of the plasma 1 by means of ellipsoids as additional optics 3 can be achieved in that the ellipsoid of revolution 33 is composed of two elliptical surfaces (with a break or bending line). A solution of this kind would have to be carried out in a manner analogous to the combination of different surfaces of revolution shown in FIG. 4.

Referring to FIGS. 2b and 2c, the disadvantage of a simple ellipsoid surface mentioned above is used to advantage by making use of the extension of the intermediate image 41 in the direction of the optical axis 42. Namely, by displacing the source location (plasma 1) relative to the focal point 31 of the ellipsoid 33, the extension of the image of the plasma 1 can be altered within certain limits. This is advantageous for some uses in which it is desirable to lengthen the source location (in this case, the intermediate image 41 as imaginary source location) along the optical axis 42.

FIG. 2b shows the imaging situation when the ellipsoid of revolution 33 is shifted by −5 mm relative to the plasma 1, while FIG. 2c shows the displacement of the focal point 31 relative to the plasma 1 by +5 mm. In the latter case, this results in virtually the same shape (extension) of the intermediate image 41 as in FIG. 2b; however, its center of gravity is shifted to positive values on the optical axis 42.

Figure 3:
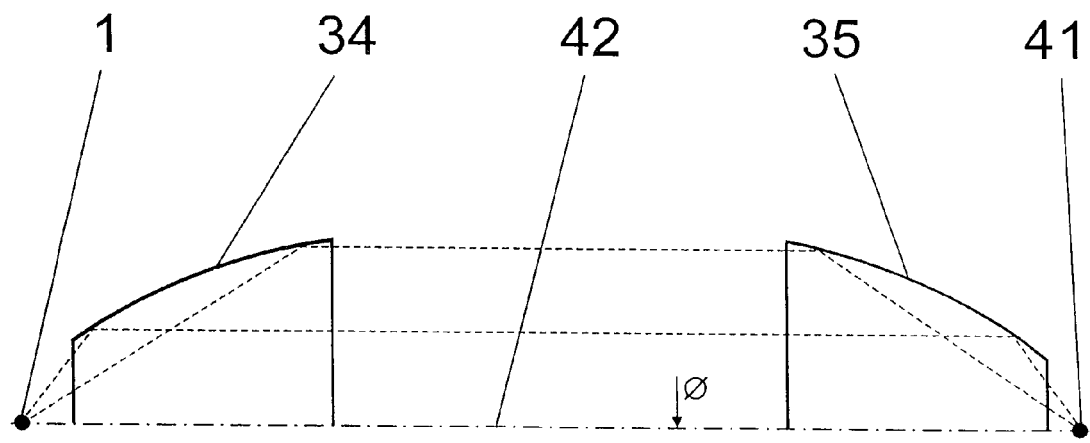
FIG. 3 is a half-sectional diagram showing an arrangement of the additional optics with reflecting surfaces in the form of paraboloids.

In the constructional variant in FIG. 3, the additional optics 3 are formed by paraboloids of revolution. In this case, the additional optics 3 are composed of two parts and comprise two paraboloid mirrors 34 and 35. These paraboloid mirrors 34 and 35 generate a virtually exact image of the plasma 1 because the imaging is not dependent upon angle. As a further advantage resulting from the two-part design, the additional optics 3 function as a supplemental debris filter because each paraboloid mirror 34 and 35, by itself, is suitable individually as an exchangeable element after a certain period of operation. The paraboloid mirror 34 closest to the source can accordingly be changed more frequently.

In another variant according to FIG. 4, the additional optics 3 are composed of two differently curved surfaces of revolution. The first surface is a hyperboloid mirror 36 and the second surface is an ellipsoid mirror 37. The two surfaces contact one another in a bending plane, as it is called, and enable an exact optical imaging of the plasma 1 in the plane of the intermediate image 41 which represents the object plane for the collector optics 4.

Such a combination of contacting mirror surfaces of revolution which can also be two ellipsoids of revolution 33 or combinations with paraboloids 34 makes it possible for EUV radiation emerging from the plasma 1 in a divergent manner from the outlet opening 11 (shown only in FIG. 2) to be bundled in a more effective manner compared to FIG. 3. However, it also allows the hyperboloid mirror 36 and ellipsoid mirror 37 to be exchanged separately and independent from one another as in the variant shown in FIG. 3.

Another advantage in this case consists in that the ellipsoid mirror 37 need not be exchanged as frequently as the hyperboloid mirror 36, and the collector optics 4 remain usable almost unlimitedly in practice.

While the foregoing description and drawings represent the invention, it will be be obvious to those skilled in the art that various changes may be made therein without departing from the true spirit and scope of the present invention.

REFERNECE NUMBERS

1 plasma
11 outlet opening
2 debris filter
3 additional optics
31, 32 focal points
33 ellipsoid of revolution
34, 35 paraboloid mirrors (paraboloids of revolution)
36 hyperboloid mirror
37 ellipsoid mirror
4 collector optics
41 intermediate image
42 optical axis

What is claimed is:

1. An arrangement for debris reduction in a radiation source based on a plasma comprising:
    a radiation-generating plasma as a source location;
    collector optics;
    a debris filter being arranged next to said radiation-generating plasma and comprising a filter structure having openings which are not covered by foil traps; and
    additional optics for forming a distance-increasing intermediate imaging of the source location and provided as a conjugated source location for the collector optics,
    wherein additional optics being arranged between the debris filter and the collector optics, and
    wherein the additional optics are provided as an auxiliary optical device having at least one reflecting surface to accept residual debris being passed through the debris filter and being exchangeable for restoring reflectivity after defined time periods when reflectivity of the additional optics has reached a defined degree of reduction due to deposition by the residual debris filter during operation of the radiation source.

2. The arrangement according to claim 1, wherein the additional optics are reflection optics.

3. The arrangement according to claim 2, wherein the additional optics have reflecting surfaces for reflection in grazing incidence.

4. The arrangement according to claim 3, wherein the reflecting surfaces of the additional optics are shaped as curved surfaces of revolution.

5. The arrangement according to claim 4, wherein the reflecting surface has the shape of an ellipsoid of revolution.

6. The arrangement according to claim 4, wherein the reflecting surface has the shape of a paraboloid of revolution.

7. The arrangement according to claim 4, wherein the reflecting surface has the shape of a hyperboloid.

8. The arrangement according to claim 4, wherein the additional optics comprise a combination of a plurality of reflecting surfaces with differently curved surfaces of revolution.

9. The arrangement according to claim 3, wherein the reflecting surfaces of the additional optics are made of metal which is highly reflective in the EUV region.

10. The arrangement according to claim 9, wherein the reflecting surfaces of the additional optics are incorporated in highly reflective metallic base material.

11. The arrangement according to claim 9, wherein the reflecting surfaces of the additional optics are coated with a highly reflective metallic coat.

12. The arrangement according to claim 9, wherein the reflecting surfaces of the additional optics contain at least one of the metals, molybdenum, rhodium or palladium.

* * * * *